United States Patent
Illerhaus et al.

(10) Patent No.: US 7,667,963 B2
(45) Date of Patent: Feb. 23, 2010

(54) MOUNT MODULE FOR AN INVERTER AND INVERTER HAVING A PLURALITY OF MOUNT MODULES

(75) Inventors: Edmund Illerhaus, Bergatreute (DE); Claus Köhler, Leutkirch (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 0 days.

(21) Appl. No.: 12/022,711

(22) Filed: Jan. 30, 2008

(65) Prior Publication Data

US 2008/0180909 A1 Jul. 31, 2008

(30) Foreign Application Priority Data

Jan. 30, 2007 (DE) .................. 10 2007 005 436

(51) Int. Cl.
*H05K 7/20* (2006.01)
(52) U.S. Cl. .................. 361/690; 361/688; 361/831
(58) Field of Classification Search ......... 361/688–690, 361/831, 809, 811, 810; 363/141, 144
See application file for complete search history.

(56) References Cited

U.S. PATENT DOCUMENTS

| | | | | |
|---|---|---|---|---|
| 3,697,815 A | * | 10/1972 | Grant et al. .................. 361/695 |
| 4,712,160 A | * | 12/1987 | Sato et al. .................... 361/710 |
| 4,755,146 A | * | 7/1988 | Rishworth et al. ............. 439/71 |
| 5,258,888 A | * | 11/1993 | Korinsky ..................... 361/704 |
| 5,283,716 A | * | 2/1994 | Banitt et al. ................. 361/810 |
| 6,285,552 B1 | * | 9/2001 | Adachi ........................ 361/705 |
| 6,317,348 B1 | | 11/2001 | Vackar |
| 6,501,650 B2 | * | 12/2002 | Edmunds et al. ............. 361/695 |
| 6,504,714 B1 | * | 1/2003 | Richter ....................... 361/695 |
| 7,002,078 B2 | | 2/2006 | Kunick et al. |
| 7,274,573 B2 | * | 9/2007 | Sevakivi ..................... 361/721 |
| 2002/0141156 A1 | * | 10/2002 | Edmunds et al. ............. 361/694 |
| 2007/0297206 A1 | * | 12/2007 | Cramer et al. ............... 363/144 |

FOREIGN PATENT DOCUMENTS

| | | |
|---|---|---|
| DE | 1233039 | 1/1967 |
| DE | 10230393 A1 | 1/2004 |
| DE | 202006009906 U1 | 11/2006 |

* cited by examiner

*Primary Examiner*—Gregory D Thompson
(74) *Attorney, Agent, or Firm*—Laurence A. Greenberg; Werner H. Stemer; Ralph E. Locher

(57) ABSTRACT

A mount module for an inverter includes a housing element with a recess being open to the front face, for holding a single inverter. The upper face and the lower face of the housing element are complementary to one another, and/or the right side and the left side of the housing element are complementary to one another, and/or the rear face of the housing element is complementary to itself. The respective side or sides and face or faces of the housing element each have at least one connection device. A relatively large number of the mount modules can be disposed one above the other, alongside one another, and/or with their rear faces against one another and can be connected to one another in order, for example, to form a central inverter unit for large photovoltaic installations.

14 Claims, 3 Drawing Sheets

MOUNT MODULE FOR AN INVERTER AND INVERTER HAVING A PLURALITY OF MOUNT MODULES

CROSS-REFERENCE TO RELATED APPLICATION

This application claims the priority, under 35 U.S.C. §119, of German Patent Application DE 10 2007 005 436.1, filed Jan. 30, 2007; the prior application is herewith incorporated by reference in its entirety.

BACKGROUND OF THE INVENTION

Field of the Invention

The present invention relates to a mount module for an inverter, and to an inverter unit having a plurality of such mount modules.

At present, large photovoltaic installations use so-called central inverters which are able to process very high electrical power levels. Installations such as those are provided not only on building roofs but also in the form of outdoor installations. Adequate weather protection must therefore be provided for corresponding central inverters.

Instead of a high-power central inverter, it is also in principle possible to use a plurality of individual string inverters which, because of the possibility of batch production, are considerably less costly overall than one large central inverter. In that context, by way of example, German Utility Modal DE 20 2006 009 906 U1 proposes a rack for holding a plurality of inverters, in which the individual inverters can be fitted detachably to the rack, and the rack also has a terminal block for power cables for the photovoltaic installation.

SUMMARY OF THE INVENTION

It is accordingly an object of the invention to provide a mount module for an inverter and an inverter having a plurality of mount modules, which overcome the hereinafore-mentioned disadvantages of the heretofore-known devices of this general type and which provide a capability of using a plurality of individual string inverters instead of one high-power central inverter, offering further advantages in comparison to an inverter unit known from German Utility Modal DE 20 2006 009 906 U1.

With the foregoing and other objects in view there is provided, in accordance with the invention, a mount module for an inverter, comprising a housing element with a recess opening toward a front face, for holding a single inverter. In order to provide an inverter unit including a plurality of mount modules, a) an upper face and a lower face of the housing element are complementary to one another, and/or b) a right side and a left side of the housing element are complementary to one another, and/or c) rear faces of the housing elements are complementary to one another. The respective side or sides and face or faces of the housing element each have at least one connection device.

A plurality of such mount modules can be disposed in a simple manner one above the other, alongside one another and/or with their rear faces against one another and can be connected to one another in order to form an inverter unit with a plurality of individual string inverters, as is suitable for large photovoltaic installations. The advantages of these mount modules according to the invention are their modularity and therefore the variable and flexible formation of different inverter units which can be optimally matched to the respective circumstances, their simple and thus cost-effective construction, their simple connection to one another to form a relatively large inverter unit, their simple and space-saving mounting and transportability, and the simple installation of the inverter units on site.

In accordance with another feature of the invention, the mount module also has a cover for closing the recess, so that the mount module also offers adequate weather protection for the inverter that has been inserted into the recess, thus allowing problem-free use in outdoor installations without additional weather protection measures and also allowing the use of inverters having a degree of protection which is not suitable for outdoor operation. The cover is preferably attached to the housing element in such a way that it can pivot between an open position and a closed position, and can be locked in its closed position, for protection against theft.

In accordance with a further feature of the invention, the connection device is a hole for a screw connection, so that the mount modules can easily be screwed to one another.

In accordance with an added feature of the invention, the housing element and its recess are constructed in such a way that the inverter can be held at an angle in the recess so that its upper end is disposed further inwards in the housing element than its lower end. This construction allows the inverter to be inserted into the mount module more easily, and simplifies the cooling air routing for the inverter that has been inserted into the recess. The housing element therefore, for example, has a cooling air path for cooling the inverter that has been inserted into the recess, with this cooling air path having an inlet opening in the lower area of the front face of the housing element and an outlet opening in the upper area of the rear face of the housing element. This cooling air routing provides a simple way to prevent the heated cooling air from a lower mount module from flowing through an upper mount module.

In accordance with an additional feature of the invention, the housing element is provided with integrated cable channels and a multiplicity of attachment points or locations for fitting further components. This structure of the mount module allows simple integration of further peripherals and problem-free matching of the mount module, that is of the inverter unit fitted thereto, to its specific requirements.

In accordance with yet another feature of the invention, in order to allow more accurate mutual positioning of the individual mount modules before they are finally connected to form an inverter unit, the respective side, sides, face or faces of the housing element can each additionally be provided with a cutout and a projection, which are disposed and constructed to be complementary to one another.

With the objects of the invention in view, there is concomitantly provided an inverter unit, comprising a plurality of mount modules according to the invention, which are disposed one above the other, alongside one another, and/or with their rear faces against one another and are connected to one another. The plurality of mount modules are preferably screwed to one another. The lowermost mount modules of the inverter unit may each be mounted on a base having an upper face which is constructed to be complementary to the lower face of the housing element of the mount modules. A locking device can be provided as theft protection for the entire inverter unit.

Other features which are considered as characteristic for the invention are set forth in the appended claims.

Although the invention is illustrated and described herein as embodied in a mount module for an inverter and an inverter having a plurality of mount modules, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The structure of a mount module according to one preferred exemplary embodiment will be explained in more detail first of all, with reference to FIGS. 1A, 1B and 1C. The structure of an inverter unit including a plurality of such mount modules will then be described with reference to FIG. 2. Finally, FIG. 3 shows the advantageous cooling of the inverters in an inverter unit constructed in this way.

Figure 1A:
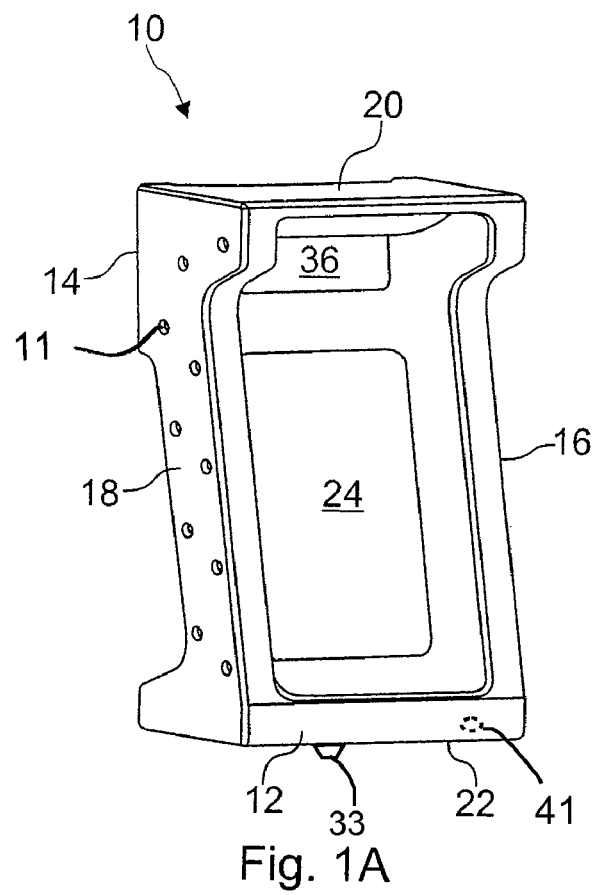
FIG. 1A is a diagrammatic, perspective view of a mount module for an inverter according to one preferred exemplary embodiment of the present invention.
Figures 1B, 1C:
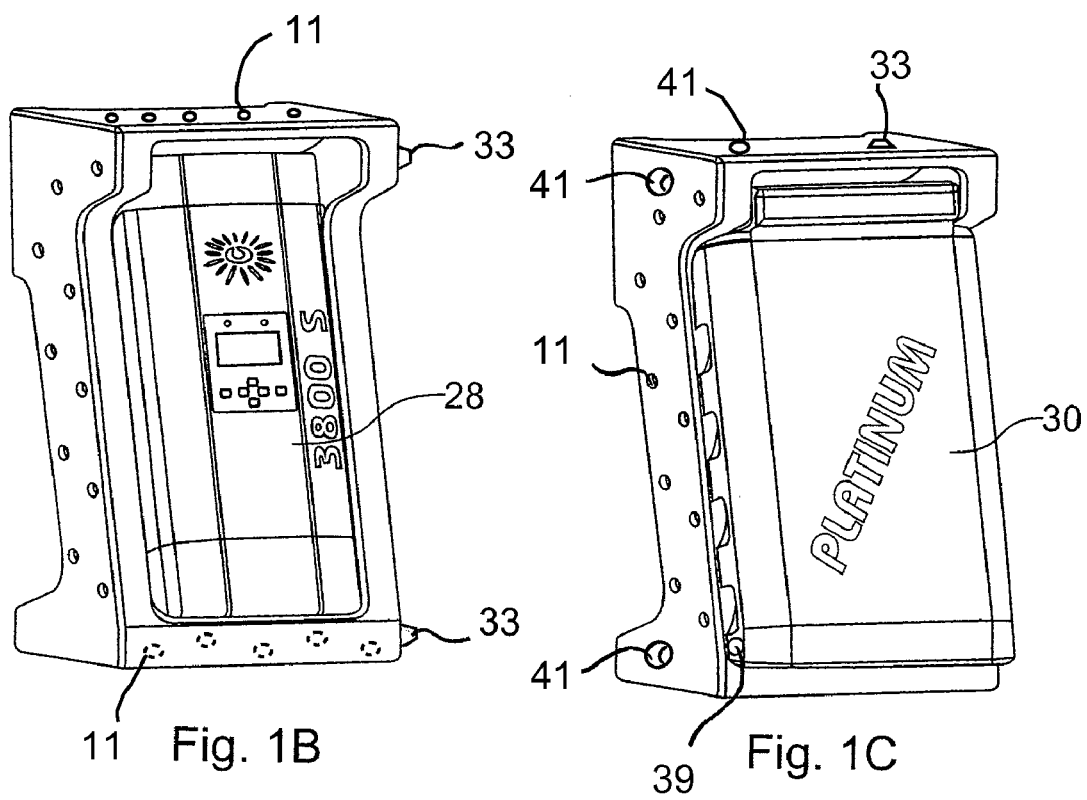
FIG. 1B is a perspective view of the mount module of FIG. 1A with an inverter inserted.
FIG. 1C is a perspective view of the mount module of FIG. 1C with a cover in its closed position.

Referring now to the figures of the drawings in detail and first, particularly, to FIGS. 1A, 1B and 1C thereof, there is seen a mount module including a housing element 10 which, for example, is manufactured from polyethylene by using the so-called centrifugal casting process, and a cover 30 which, for example, is manufactured from polypropylene by using the particle foam process. However, of course, other materials and manufacturing techniques can also be used for these components within the scope of the invention.

The housing element 10 has a front face 12, a rear face 14, a right-hand side 16, a left-hand side 18, an upper face 20, a lower face 22 and a recess 24 (see in particular FIG. 1A). A single string inverter 28 can be inserted into the recess 24 (see FIG. 1B). In this case, the inverter 28 is disposed at an angle in the mount module in such a way that its upper end is disposed further inwards in the housing element 10 than its lower end.

The recess 24 (with the inverter 28 inserted therein) can preferably be closed through the use of the cover 30. This cover 30 is attached to the housing element 10 in such a way that it can be pivoted between an open position, in which the inverter 28 can be inserted into the recess and removed from it, and a closed position, in which the inverter 28 is protected in the housing element 10 (see also FIG. 2). The cover 30 can be used to provide weather protection for the mount module in a simple manner without any need to take further additional measures, such as a protective housing, for example. A locking apparatus 40, in the form of a metal rod shown in FIG. 2 having holes 37, 38 formed therein, may be inserted through holes 39 passing through a cover 30 and a housing element 10, thus providing a certain amount of protection against theft (within the scope of the strength of the cover material, of course). The rod may, if required, be locked through the use of padlocks passing through the holes 37, 38. Of course, a longer rod may pass through all of the covers and housing elements in a row. A wire rope or cable with loops at the ends for a padlock, may be used instead of the rod.

Figure 2:
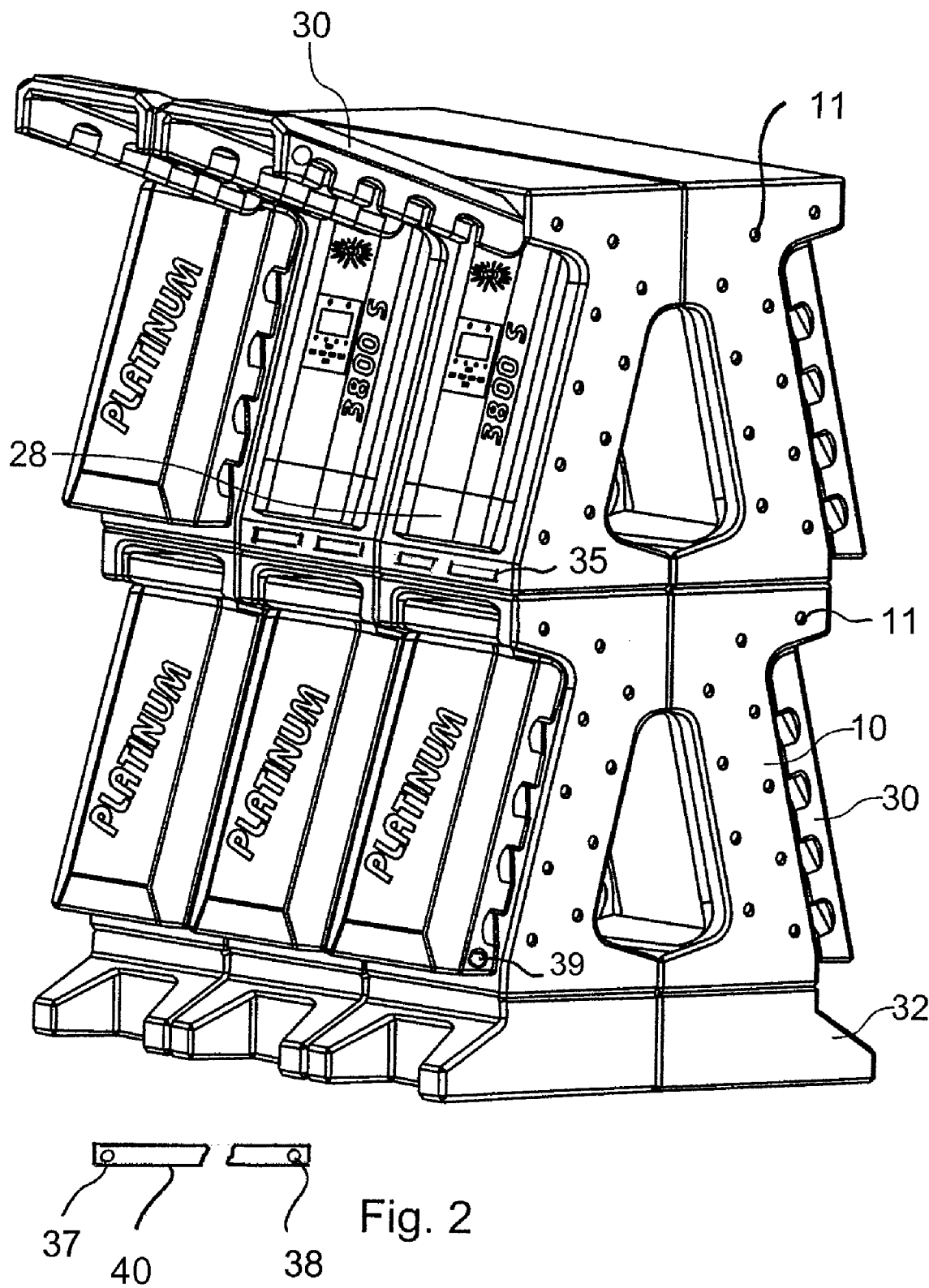
FIG. 2 is a perspective view of an inverter unit composed of a plurality of mount modules of FIG. 1.
Figure 3:
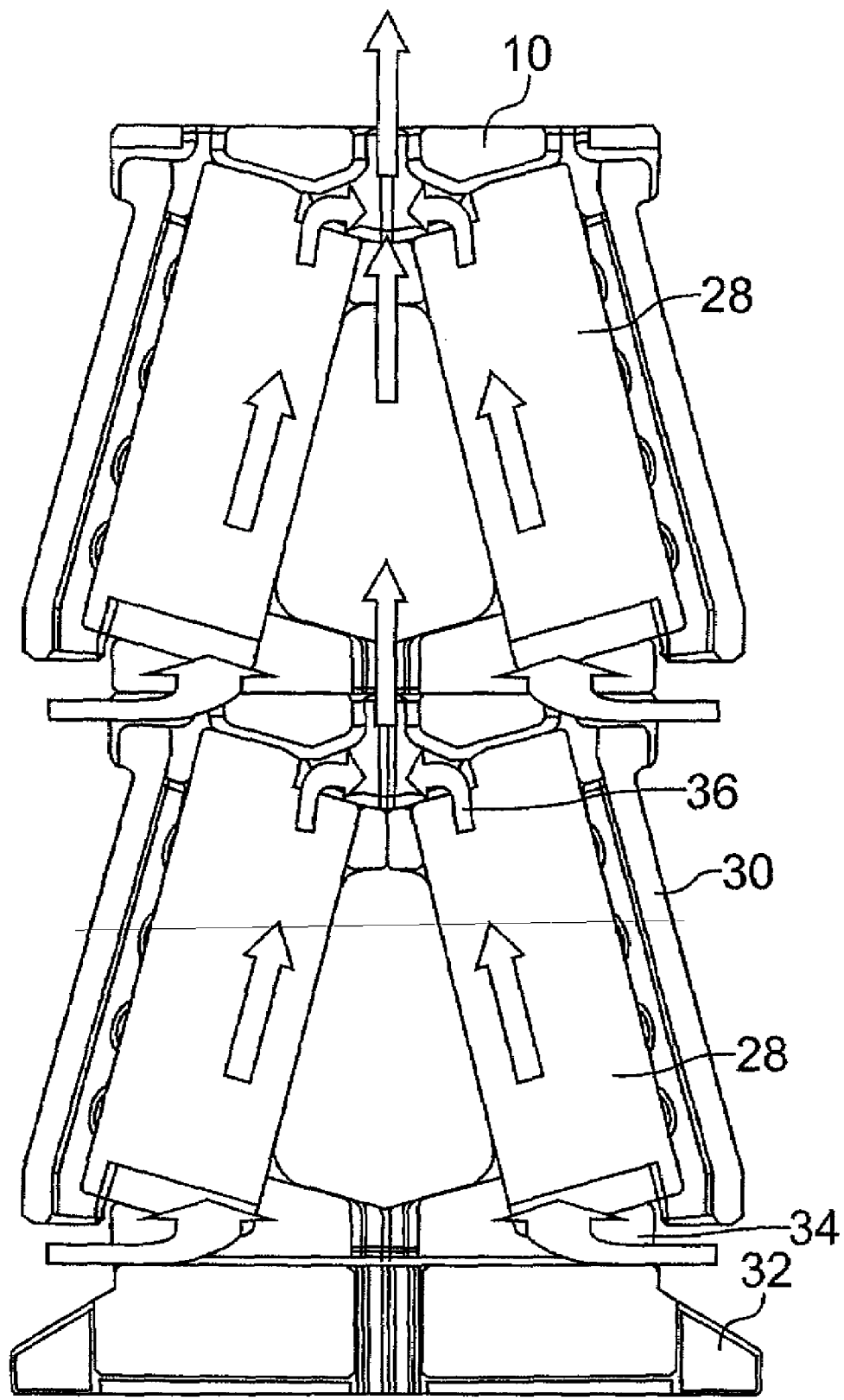
FIG. 3 is a vertical-sectional view of the inverter unit of FIG. 2, presented in order to illustrate cooling air paths through the mount modules of FIG. 1.

The housing element 10 is preferably provided with integrated cable channels 35 for ac and dc cables, as seen in FIG. 2. Of course, integrated cable channels 35 may also be provided in all of the housing elements as well. A multiplicity of attachment points 11, in the form of through holes for nuts and bolts, or blind self-tapping holes, are also provided, by which further peripherals (isolating switches, remote monitoring, lightning protection, automatic fuses, etc.) can also be integrated in the mount module, as required. The various attachment points, which are never all used at the same time, result in a multiplicity of solutions which can be improvised if specific problems (particular spatial conditions, specific accessories, etc.) have to be solved for installation on site.

Since each inverter 28 is connected through the use of its standard plug, which is either accessible through an opening in the housing element 10 of the mount module or is connected to a plug connector provided on the housing element 10, an inverter 28 can be replaced within a very short time, even without using trained specialist personnel.

As can be seen in the illustrations in FIGS. 1 to 3, the inverter 28 can be inserted into the recess 24 in the housing element 10 in such a way that the inverter 28 is at an angle in the mount module. In particular, as mentioned above, the inverter 28 is placed at an angle in such a way that its upper end is disposed further inwards in the housing element 10 than its lower end. This structure allows the inverter 28 to be inserted more easily into the mount module, and also simplifies the cooling air routing for the inverter which has been inserted into the recess, as will be described below.

FIG. 2 shows an example of how a plurality of mount modules (in this case twelve) can be combined to form one large inverter unit with a high overall power. In the illustrated example, in each case, two mount modules are disposed one above the other, three mount modules are disposed alongside one another and two mount modules are disposed with their rear faces against one another. In this case, the mount modules are preferably firmly connected by screw connections through the use of the holes 11 provided in the housing elements 10 (which provide a connection device according to the invention).

In order to allow the plurality of mount modules to be combined in the manner shown to form an inverter unit, the upper face 20 and the lower face 22 of the housing element 10 of the mount modules are constructed to be complementary to one another, the right-hand side 16 and the left-side 18 of the housing element 10 of the mount modules are constructed to be complementary to one another, and the rear faces 14 of the housing elements 10 of the mount modules are constructed to be complementary to one another, so that the respective sides and faces can be matched together well. In order to simplify the assembly of the inverter unit, the respective sides and faces 14-22 of the housing element 10 can additionally be provided with conical cutouts or cavities 41 and conical projections 33, which are disposed and constructed to be complementary to one another, in order to allow exact prepositioning before the mount modules are actually connected to one another. Of course, the conical cutouts or cavities 41 and conical projections 33 can be provided on the top and bottom or any other surfaces of the housing element as well.

As is illustrated in FIG. 2, the lowermost mount modules are each mounted on a base 32. For this purpose, the upper face of the base is constructed to be complementary to the lower face 22 of the housing element 10 of the mount modules.

As mentioned above, a locking apparatus can be provided in the inverter unit, for protection against theft. This locking apparatus is, for example, the locking rod or bar 40 which runs transversely through the entire unit.

If there is a very large number of accessories for the inverter unit, it may also be worthwhile installing all of the accessories (DC isolators, main fused switches, electricity meters, lightning protection, Internet link, etc.) for the entire inverter unit in one mount module.

A cooling air path for cooling an inverter 28 that has been inserted into the recess 24 in the mount modules according to the invention, will now be explained in more detail with reference to FIG. 3.

The cooling air path has an inlet opening 34 in a lower area of the front face 12 of the housing element 10 and an outlet opening 36 (see also FIG. 1A) in an upper area of the rear face 14 of the housing element 10. As is indicated by arrows in FIG. 3, this cooling air routing provides a simple way to prevent the cooling air which is being heated by a lower mount module from flowing through an upper mount module and heating the upper inverter 28 in the process. The cooling air which has been heated by the inverters 28 flows upwards in the center of the inverter unit and out of the inverter unit.

The particular advantage of the present invention is the modularity of the individual mount modules and thus the variable and flexible formation of different inverter units which can be optimally matched to the respective circumstances. The mount modules are simple and therefore cost-effective, and they can easily be connected to one another to form a relatively large inverter unit. Existing inverter units can be expanded or reduced in size without any problems. The individual mount modules are also simple to store and to transport. The entire assembly can be installed quickly on site without any problems, even without trained specialist personnel, through the use of pre-wiring and prefabrication of the mount modules with peripherals in relatively large units.

The invention claimed is:

1. A mount module for an inverter of a photovoltaic installation, the mount module comprising:
    a housing element having an upper face, a lower face, a right side, a left side, a rear face and a front face;
    said front face having a recess formed therein for receiving a single inverter of a photovoltaic installation;
    at least one of said upper and lower faces, right and left sides or rear face and a rear face of another housing element, being complementary to one another; and
    said rear face, right side, left side, upper face and lower face each having at least one respective connection device.

2. The mount module for an inverter according to claim 1, which further comprises a cover for closing said recess.

3. The mount module for an inverter according to claim 2, wherein said cover is attached to said housing element for pivoting between an open position and a closed position.

4. The mount module for an inverter according to claim 3, wherein said cover is lockable in said closed position.

5. The mount module for an inverter according to claim 1, wherein said connection device is a hole for a screw connection.

6. The mount module for an inverter according to claim 1, wherein the inverter has an upper end and a lower end, and said housing element and said recess are constructed for holding the inverter at an angle in said recess with the upper end of the inverter disposed further inwards in said housing element than the lower end of the inverter.

7. The mount module for an inverter according to claim 1, wherein said housing element has a cooling air path for cooling an inverter inserted into said recess, said cooling air path having an inlet opening in a lower region of said front face of said housing element and an outlet opening in an upper region of said rear face of said housing element.

8. The mount module for an inverter according to claim 1, wherein said housing element has integrated cable channels.

9. The mount module for an inverter according to claim 1, wherein said housing element has a multiplicity of attachment points for fitting further components.

10. The mount module for an inverter according to claim 1, wherein said rear face, right side, left side, upper face and lower face of said housing element each have a respective cutout and projection disposed and constructed to be complementary to one another.

11. An inverter unit of a photovoltaic installation, comprising:
    a plurality of mount modules including said housing element and said another housing element according to claim 1;
    said mount modules being disposed one of:
        above one another,
        alongside one another or
        against one another at said rear faces; and
    said mount modules being connected to one another.

12. The inverter unit according to claim 11, wherein said plurality of mount modules are screwed to one another.

13. The inverter unit according to claim 11, which further comprises a base having an upper face, said plurality of mount modules including at least two lowermost mount modules mounted on said base, said upper face of said base being complementary to said lower faces of said housing elements of said lowermost mount modules.

14. The inverter unit according to claim 11, which further comprises a locking device for entirely locking the inverter unit.

* * * * *